United States Patent
Son et al.

(10) Patent No.: US 7,339,262 B2
(45) Date of Patent: Mar. 4, 2008

(54) TAPE CIRCUIT SUBSTRATE AND SEMICONDUCTOR APPARATUS EMPLOYING THE SAME

(75) Inventors: Dae-Woo Son, Cheonan-si (KR); Sa-Yoon Kang, Seoul (KR); Kwan-Jai Lee, Cheonan-si (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 0 days.

(21) Appl. No.: 10/900,211

(22) Filed: Jul. 28, 2004

(65) Prior Publication Data

US 2005/0093114 A1     May 5, 2005

(30) Foreign Application Priority Data

Nov. 4, 2003     (KR)    .............. 10-2003-0077570

(51) Int. Cl.
*H01L 23/495*     (2006.01)
(52) U.S. Cl. .............. 257/671; 257/E23.065; 257/666; 257/676; 257/678; 257/668; 257/669; 438/613; 438/183; 438/123; 29/827; 174/52.4
(58) Field of Classification Search ........ 257/E23.004, 257/E23.043–E23.05, 678, 676, E23.039, 257/E23.092, 666, 778, 766, E23.065, 668, 257/669, 648, 671; 438/613, 183, 123; 437/183; 29/827, 589, 588; 174/52.4, 260, 266
See application file for complete search history.

(56) References Cited

U.S. PATENT DOCUMENTS

| 4,445,271 | A | * | 5/1984 | Grabbe | ............ 29/827 |
| 4,862,246 | A | * | 8/1989 | Masuda et al. | ............. 257/666 |
| 5,150,193 | A | * | 9/1992 | Yasuhara et al. | ........... 257/669 |
| 5,218,229 | A | * | 6/1993 | Farnworth | ............ 257/676 |
| 5,340,771 | A | * | 8/1994 | Rostoker | ........... 29/827 |
| 5,381,037 | A | * | 1/1995 | Olivarez | ............ 257/666 |
| 5,386,141 | A | * | 1/1995 | Liang et al. | ............. 257/676 |
| 5,436,492 | A | * | 7/1995 | Yamanaka | ............ 257/433 |
| 5,767,009 | A | * | 6/1998 | Yoshida et al. | ............ 438/613 |
| 5,814,877 | A | * | 9/1998 | Diffenderfer et al. | ........ 257/666 |

(Continued)

FOREIGN PATENT DOCUMENTS

JP     11-307591     11/1999

(Continued)

OTHER PUBLICATIONS

Korean Office Action dated Aug. 25, 2005.

*Primary Examiner*—Kenneth Parker
*Assistant Examiner*—Chris C. Chu
(74) *Attorney, Agent, or Firm*—Harness, Dickey & Pierce, PLC

(57) ABSTRACT

A tape circuit substrate and semiconductor apparatus employing the same, and a method for forming a tape circuit substrate may reduce or eliminate electromagnetic interference (EMI) and provide a substrate or apparatus which can supply a more stable power supply voltage. The tape circuit substrate may include an insulation film and a wiring pattern formed on the insulation film to define an electronic device-mounting region and including a ground electrode. The tape circuit substrate may include a ground electrode pattern formed at the electronic device-mounting region so as to be insulated from the wiring pattern, except where the ground electrode pattern is connected to the ground electrode.

39 Claims, 7 Drawing Sheets

U.S. PATENT DOCUMENTS

| | | | | |
|---|---|---|---|---|
| 5,844,307 | A | * | 12/1998 | Suzuki et al. ................ 257/690 |
| 6,091,133 | A | * | 7/2000 | Corisis et al. ............... 257/666 |
| 6,160,307 | A | * | 12/2000 | Kweon ....................... 257/676 |
| 6,258,629 | B1 | * | 7/2001 | Niones et al. ............... 438/111 |
| 6,462,422 | B2 | * | 10/2002 | Huang ........................ 257/777 |
| 6,577,012 | B1 | * | 6/2003 | Greenwood et al. ........ 257/766 |
| 6,627,981 | B2 | * | 9/2003 | Shibata ....................... 257/678 |
| 2002/0145180 | A1 | * | 10/2002 | Terui et al. ................. 257/666 |

FOREIGN PATENT DOCUMENTS

| | | |
|---|---|---|
| KR | 2000-0034879 | 6/2000 |
| KR | 2003-0005022 | 1/2003 |

* cited by examiner

TAPE CIRCUIT SUBSTRATE AND SEMICONDUCTOR APPARATUS EMPLOYING THE SAME

PRIORITY STATEMENT

This application claims the priority of Korean Patent Application No. 2003-77570, filed on Nov. 4, 2003 in the Korean Intellectual Property Office, the disclosure of which is incorporated herein in its entirety by reference.

BACKGROUND OF THE INVENTION

1. Field of the Invention

The present invention relates, in general, to a tape circuit substrate and a semiconductor apparatus employing the same, in which electromagnetic interference (EMI) may be substantially reduced or eliminated and where a more stable power supply voltage may be supplied.

2. Description of the Related Art

With the recent trend toward miniaturization, slimness and lightness in electronic apparatuses such as personal digital assistants (PDAs) and thin film transistor liquid crystal displays (TFT LCDs), such miniaturization, slimness and lightness are also required for the mounting of semiconductor devices installed on such electronic apparatuses.

To meet these requirements, a tape automated bonding (TAB) type of tape circuit substrate is used in mounting of semiconductor devices. According to the TAB method, bump electrodes formed in advance on a semiconductor device are collectively bonded to wiring patterns formed on a tape circuit substrate. The TAB method for forming tape circuit substrates includes chip-on-film (COF) and tape carrier package (TCP) methods.

A semiconductor apparatus in which mounting is performed by means of the TAB method is disclosed in Korean Patent Laid-Open Publication No. 2003-0005022 (the '022 publication', published on Jan. 15, 2003). The '022 publication discloses semiconductor devices mounted on a circuit substrate, wherein position mismatch between the semiconductor devices and wiring patterns of the circuit substrate may be prevented.

However, for the semiconductor apparatus disclosed in the '022 publication, a plurality of ground electrodes are arranged so as to be spaced apart from one another with respect to the wiring pattern. The ground electrodes are then electrically connected to a common ground. Thus, a substantial length of the wiring is needed between each of the ground electrodes, or between the ground electrodes and the common ground. Since the length of wiring illustrated in the '022 publication is substantially long, a parasitic capacitance C, parasitic inductance L and parasitic resistance R on the wiring may be increased, and thus a transient state voltage is applied to the ground electrodes. This may be undesirable.

For example, at a time when a ground voltage is switched on, the voltage of the ground electrodes cannot reach a constant voltage (as a reference voltage) due to the parasitic capacitance, inductance and resistance. Accordingly, ripples are produced and power noise may be induced.

Recently, semiconductor devices mounted on semiconductor apparatuses such as described above have been using high-speed clock signals or logic signals to efficiently perform a variety of functions. Therefore, electromagnetic interference (EMI) may be produced (caused by electromagnetic waves irradiated directly from or propagated through these semiconductor devices). This produced EMI may disturb semiconductor devices mounted on neighboring semiconductor apparatuses, for example.

With the increased use of semiconductor apparatuses and the development of digital technologies, EMI generated from these apparatuses causes malfunction in semiconductor apparatuses performing precise functions. EMI may also have adverse influences on the human body, and adds to radio wave noise interference, which is emerging as a substantial problem.

Therefore, the minimization of EMI is currently being viewed as a necessary and important standard. Accordingly, a standard for restricting such EMI below a given value has been established, in an effort to internationally regulate EMI in such semiconductor apparatuses.

SUMMARY OF THE INVENTION

An exemplary embodiment of the present invention is directed to a tape circuit substrate. The tape circuit substrate may include an insulation film, a wiring pattern formed on the insulation film to define an electronic device-mounting region and including a ground electrode, and a ground electrode pattern which is formed at the electronic device-mounting region on the insulation film. The ground electrode pattern is formed so as to be insulated from the wiring pattern except where the ground electrode pattern is connected to the ground electrode.

Another exemplary embodiment of the present invention is directed to a tape circuit substrate. The tape circuit substrate may include an insulation film, a wiring pattern formed on the insulation film to define an electronic device-mounting region and including a ground electrode, and a ground electrode pattern which is formed at the electronic device-mounting region on the insulation film. The ground electrode pattern is formed so as to be insulated from the wiring pattern except for where the ground electrode pattern is connected to the ground electrode. The tape circuit substrate may include an opening for exposing at least a portion of the ground electrode pattern.

Another exemplary embodiment of the present invention is directed to a semiconductor apparatus. The semiconductor apparatus may include an insulation film, a wiring pattern formed on the insulation film to define an electronic device-mounting region and including a ground electrode, and a ground electrode pattern which is formed at the electronic device-mounting region on the insulation film. The ground electrode pattern is formed so as to be insulated from the wiring pattern except where the ground electrode pattern is connected to the ground electrode. The semiconductor apparatus may further include a semiconductor device connected to the wiring pattern and mounted on the electronic-device mounting region.

Another exemplary embodiment of the present invention is directed to a method of forming a tape circuit substrate. In the method, an insulation film is provided, and a wiring pattern is formed on the insulation film to define an electronic device-mounting region. The wiring pattern includes a ground electrode. A ground electrode pattern may be formed at the electronic device-mounting region so as to be insulated from the wiring pattern except where the ground electrode pattern is connected to the ground electrode.

BRIEF DESCRIPTION OF THE DRAWINGS

Exemplary embodiments of the present invention will become more fully understood from the detailed description herein below and the accompanying drawings, wherein like elements are represented by like reference numerals, which are by way of illustration only and thus do not limit the exemplary embodiments of the present invention and wherein.

DETAILED DESCRIPTION OF THE EXEMPLARY EMBODIMENTS

Figure 1:
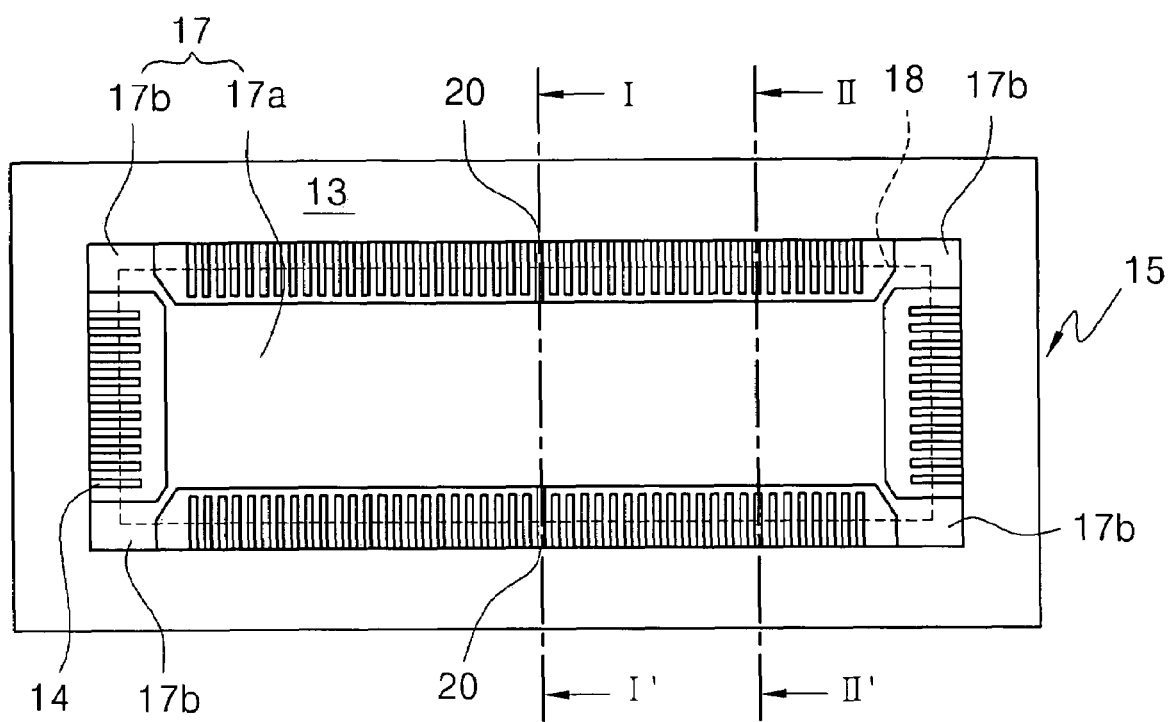
FIG. 1 is a plan view of a tape circuit substrate according to an exemplary embodiment of the present invention.

Hereinafter, a tape circuit substrate, a ground electrode pattern and a semiconductor apparatus according to exemplary embodiments of the present invention will be described in detail with reference to the accompanying drawings. Details of other exemplary embodiments are disclosed and illustrated herein and the drawings.

When it is written that a pattern, film or layer may be formed "on" another pattern, film, layer or a substrate, the layer can be formed directly on the other pattern, film, layer or substrate, or other patterns, films or layers may intervene there between.

The present invention is not limited to the following exemplary embodiments but can be implemented in other various forms. The exemplary embodiments make the disclosure of the present invention complete and provide those skilled in the art with the complete understanding of the scope of the present invention. The exemplary embodiments of the present invention are defined only by the appended claims. Like reference numerals designate like elements throughout the following description.

FIG. 1 is a plan view of a tape circuit substrate according to an exemplary embodiment of the present invention. A tape circuit substrate 15 may include an insulation film 13, a wiring pattern 14 and a ground electrode pattern 17. The insulation film 13 may be formed of a material having insulation properties such as polyimide resin or polyester resin, although these are only exemplary insulation materials. The insulation film 13 may be made of materials having somewhat similar insulation properties to that of polyimide resin or polyester resin.

The wiring pattern 14 may be formed on the insulation film 13 and defines an electronic device-mounting region 18. The wiring pattern 14 delivers electric signals to an electronic device (not shown) and may include a plurality of ground electrodes 20. Further, the wiring pattern 14 may be covered with a protective film to protect the wiring pattern from the external environment. The protective film may be composed of a solder resist or other similar protective film.

As will be discussed in further detail below, the ground electrode pattern 17 may include a primary pattern 17a and a plurality of auxiliary patterns 17b. The ground electrode pattern 17 may be formed on the insulation film 13 so as to be insulated from substantially all of the wiring pattern 14 except a portion of the wiring pattern 14 that includes the ground electrodes 20. The ground electrode pattern 17 is electrically connected to the ground electrodes 20.

Figure 2:
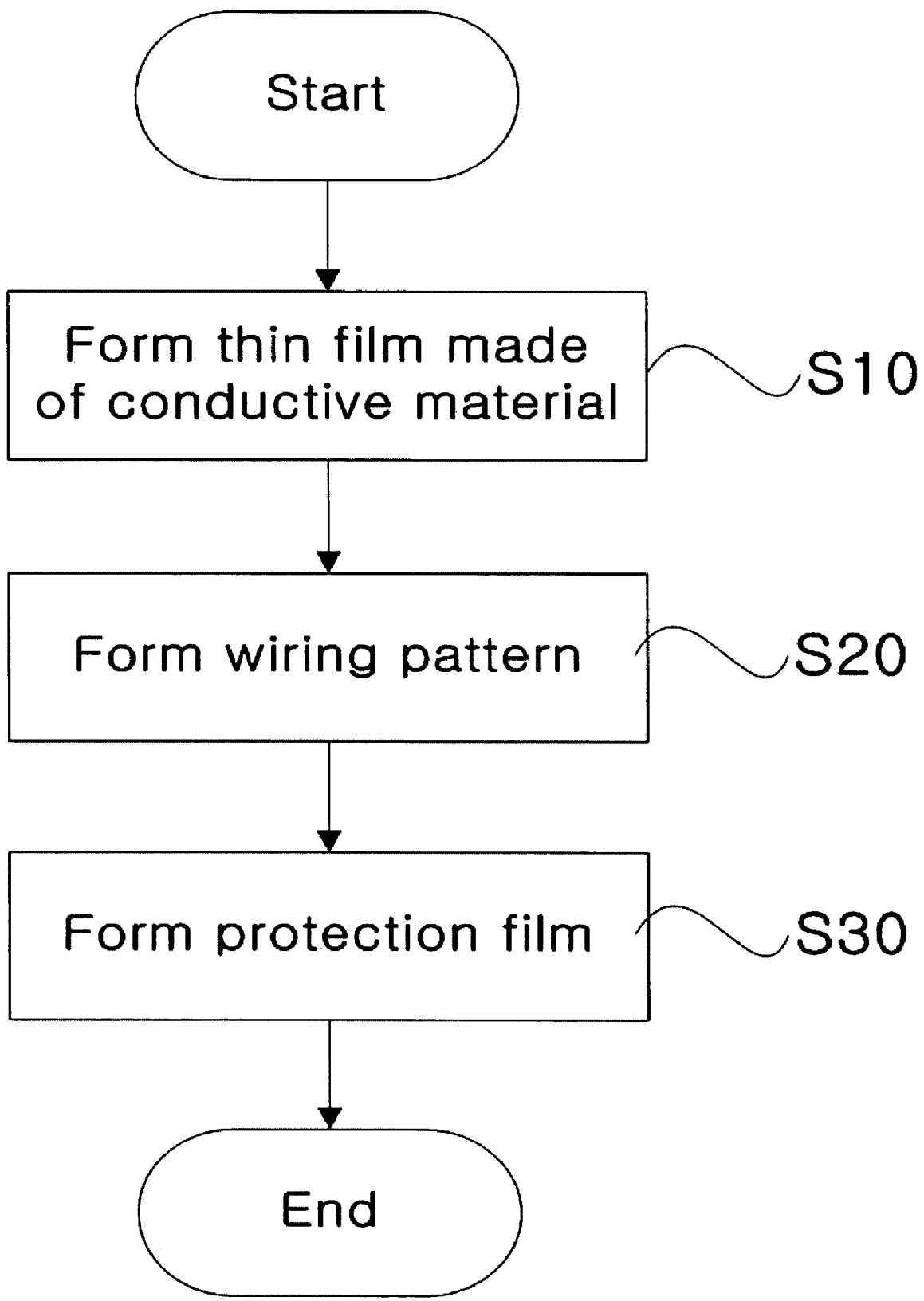
FIG. 2 is flowchart illustrating a method of manufacturing the tape circuit substrate according to an exemplary embodiment of the present invention.

FIG. 2 is flowchart illustrating a method of manufacturing the tape circuit substrate according to an exemplary embodiment of the present invention. To form the tape circuit substrate 15, a thin film made of a conductive material may be initially formed on the insulation film 13 (S10). The thin film may be formed by means of a laminating method using an adhesive, for example. Alternatively, the thin film may be formed by performing a sputtering process on the insulation film 13.

The wiring pattern 14 may then be formed on the thin film (S20). The wiring pattern 14 may be formed by selectively etching the thin film, for example. This may be accomplished by using a photo/etching process on the thin film, for example.

The protective film may then be formed (S30). The protective film can be composed of an insulation material such as a solder resist, for example. The protective film may be formed in such a manner that the wiring pattern 14 is not exposed to the external environment of the tape circuit substrate 15. At the least, only an electronic device-mounting region 18 of the insulation film 13 is exposed. This is shown in greater detail below.

Figure 3A:
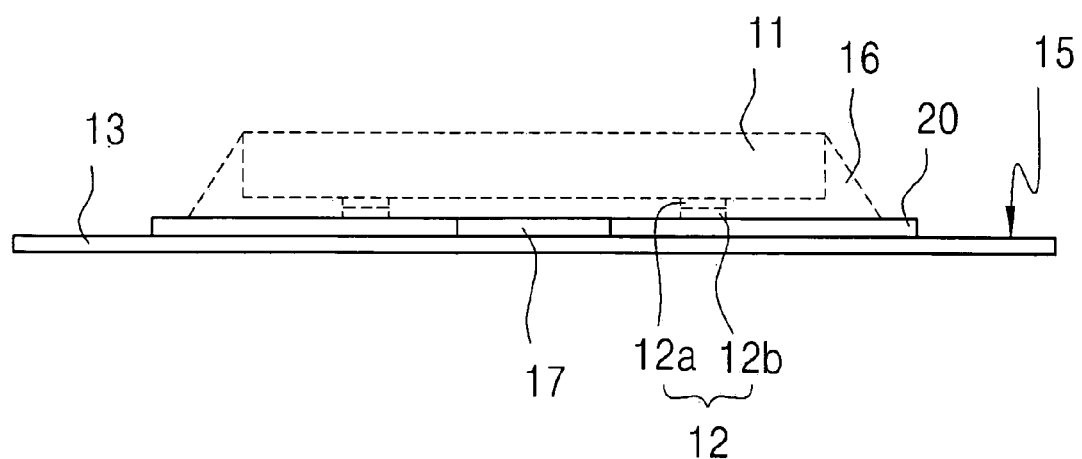
FIGS. 3A and 3B are sectional views of the tape circuit substrate according to the exemplary embodiment of FIG. 1.
Figure 3B:
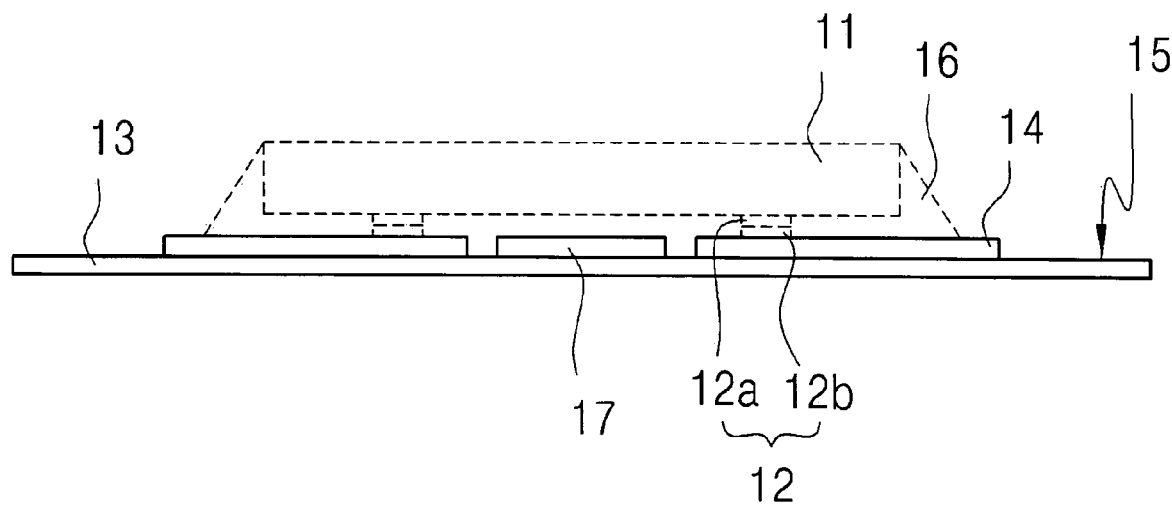

FIGS. 3A and 3B are sectional views of the tape circuit substrate according shown in FIG. 1. FIG. 3A is a sectional view taken along line I-I' of FIG. 1. FIG. 3A illustrates a state where the ground electrode pattern 17 is connected to the ground electrodes 20. FIG. 3B is a sectional view taken along line II-II' of FIG. 1. FIG. 3B illustrates a state where the ground electrode pattern 17 is insulated from the wiring pattern 14.

A plurality of electrodes 12 are formed on a semiconductor device 11. The semiconductor device 11 may be mounted on electronic apparatuses such as cellular phones, PDAs and TFT LCDs, for example, to control the operations of these electronic apparatuses. Each of the electrodes 12 may include a pad electrode 12a and a bump electrode 12b. The bump electrodes 12b may be made of a suitable conductive material, for example, and may be arranged at positions corresponding to the wiring pattern 14.

To mount the semiconductor device 11 on the tape circuit substrate 15, the semiconductor device 11 is aligned with the electronic device-mounting region 18 and then subjected to an inner lead bonding (ILB) process, for example, so that the bump electrodes 12b are bonded and electrically connected to leads of the wiring pattern 14 on the tape circuit substrate 15. The semiconductor device 11 and tape circuit substrate 15 may then be sealed with a sealing resin 16 as a potting resin, for example, so as to be protected from the external environment.

Thermosetting resins composed of a material such as epoxy resin or silicon resin may be used as the sealing resin 16 and applied to the semiconductor device 11 through a nozzle. The sealing resin 16 may be introduced into a space between the semiconductor device 11 and the tape circuit substrate 15 and then cured with application of heat in a reflow manner, for example. Alternatively, an ultraviolet curable resin may be used as the sealing resin 16. In this case, ultraviolet rays may be irradiated to cure the sealing resin 16.

EMI may be induced because the wiring pattern 14 functions as an antenna and radiates electromagnetic waves, or because a power supply voltage fluctuates due to high-speed clock signals or logic signals. To efficiently reduce or possibly eliminate these phenomena, it may be desirable to stabilize the ground electrodes 20.

The primary pattern 17a of the ground electrode pattern 17 may be formed on an entire surface of the electronic device-mounting region 18 in an effort to ensure insulation of the primary pattern 17a from the wiring pattern 14. Accordingly, as shown in FIG. 1, the primary pattern 17a can be formed in a planar shape. Further, the shape of the primary pattern 17a may be substantially the same as the shape of the electronic device-mounting region 18, so that the area of the mounting region 18 can be efficiently used.

In the case where the primary pattern 17a of the ground electrode pattern 17 is formed in a planar shape, electromagnetic waves generated from the semiconductor device 11, or radiated from the wiring pattern 14 functioning as an antenna, may be shielded by the planar primary pattern 17a of the ground electrode pattern 17, thereby efficiently reducing or eliminating the EMI.

Further, since the planar primary pattern 17a of the ground electrode pattern 17 can attain a relatively stable self-capacitance, it is possible to reduce common noise (in which ripples are generated at a ground voltage so as to prevent attaining a constant reference voltage), or cross-talk (in which the ground voltage interferes with a power supply voltage if the power supply voltage is provided to a neighboring power-supply-voltage electrode).

Further, the length of the wiring for supplying the ground voltage can be shortened by forming the planar primary pattern 17a of the ground electrode pattern 17. Since the ground electrodes 20 have no limitations on respective positions on the wiring pattern 14 (so far as the ground electrodes 20 are electrically connected to the primary pattern 17a of the ground electrode pattern 17), the wiring length may be substantially shortened.

If the wiring length is shortened, the parasitic capacitance, parasitic inductance and parasitic resistance on the wiring of the ground electrodes 20 may be reduced. Thus, resonance or reflection due to parasitic capacitance, inductance and resistance may be substantially reduced and/or possibly eliminated. Harmonic components due to the wiring of the ground electrodes may also be reduced, and radiation of standing waves or electromagnetic waves may be reduced.

Further, since a transient state voltage (due to the parasitic capacitance, inductance and resistance) is reduced and/or eliminated at the time a ground voltage is switched on, power noise may be reduced, thereby supplying a stable ground voltage to the semiconductor device 11.

The primary pattern 17a may be formed in a symmetric configuration on the insulation film 13. Accordingly, the wiring length between the primary pattern 17a and a given ground electrode 20 may be uniform, regardless of the positional arrangements of the ground electrodes 20 on the wiring pattern 14.

As described above, the semiconductor device 11 is aligned with the electronic device-mounting region 18 on the tape circuit substrate 15 and subjected to the inner lead bonding (ILB), so that the bump electrodes 12b of the semiconductor device 11 are bonded to the leads of the wiring pattern 14 of the tape circuit substrate. Further as described above, the primary pattern 17a is formed at the entire surface of the electronic device-mounting region 18 on the insulation film 13 below the semiconductor device 11 to ensure insulation thereof from the wiring pattern 14. The insulation film 13 is made of an insulation material such as polyimide resin or polyester resin, and the primary pattern 17a may be made of a conductive material such as Cu, for example.

Since the coefficient of linear expansion of the polyimide resin is larger than the coefficient of linear expansion of the conductive material, the coefficient of linear expansion of the insulation film 13 is greater than the coefficient of linear expansion of the primary pattern 17a of the ground electrode pattern. Therefore, if the same degree of thermal stress is applied to the insulation film 13 and the primary pattern 17a, the insulation film 13 will expand to a greater degree than the primary pattern 17a.

In other words, when ILB is performed, the insulation film 13 and the primary pattern 17a expand according to the respective coefficients of linear expansion. However, since the primary pattern 17a is formed on the insulation film 13, the expansion of the insulation film 13 may be limited.

Therefore, it is possible to reduce bonding failure that may be generated because the insulation film 13 expands such that the bump electrodes 12b on the semiconductor device 11 do not align with the wiring pattern 14 of the tape circuit substrate 15, when subjected to ILB.

In a case where the primary pattern 17a of the ground electrode pattern is not formed, it may be substantially difficult to form a pitch in the wiring pattern 14 below 30 μm on the insulation film 13 due to bonding failure.

However, a fine pitch in the wiring pattern 14 may be effectively achieved, since it is possible to provide a margin for bonding failure by forming the primary pattern 17a of the ground electrode pattern as described above.

Further, since heat generated from the semiconductor device 11 can be dissipated to the outside through the primary pattern 17a of the ground electrode pattern, it may be possible to reduce the probability or altogether avoid malfunction of the semiconductor device 11 due to accumulated heat.

Auxiliary patterns 17b of the ground electrode pattern are formed at corners of the insulation film 13 and connected to the primary pattern 17a. Therefore, it is possible to effectively secure regions of the ground electrode pattern 17 on the insulation film 13 at portions or areas where the wiring pattern 14 is not formed, in an effort to ensure insulation thereof from the wiring pattern 14. Moreover, with use of the auxiliary patterns 17b, the expansion of the insulation film 13 due to ILB may be even further limited.

Further, dummy electrodes may additionally be formed at given regions on the semiconductor device 11 which correspond to the auxiliary patterns 17b, and which are bonded to the auxiliary patterns 17b. The inclusion of dummy electrodes may further limit the expansion of the insulation film 13 due to the ILB process.

The ground electrode pattern 17 be made of the same conductive material as the wiring pattern 14. Therefore, the ground electrode pattern 17 can be formed simultaneously with the wiring pattern 14 using the same manufacturing process. This avoids having to use a new manufacturing process for the ground electrode pattern 17, thereby improving manufacturing efficiency.

Further, in the case where the ground electrode pattern 17 is made of the same conductive material as the wiring pattern 14, the impedance of the ground electrode pattern 17 is identical to that of the wiring pattern 14. Thus, the impedance may be matched there between without insertion of an additional impedance-matching circuit.

Accordingly, the reflection of electromagnetic waves can be reduced between the ground electrode pattern 17 and the wiring pattern 14. Further, the capacitance and the resistance of the ground electrode pattern 17 becomes identical to the capacitance and resistance of the wiring pattern 14. There-fore, even though the plurality of ground electrodes 20 are arranged on the wiring pattern 14, the ground voltage may be simultaneously delivered to the plurality of ground electrodes 20 so that skew of propagation delay (RC delay) between the plurality of ground electrodes 20 can be substantially reduced or eliminated. Consequently, the ground electrode pattern 17 may be formed of Cu.

The ground electrode pattern 17 is formed of the same conductive material as the wiring pattern 14, and is electrically connected to the ground electrodes 20 of the wiring pattern 14 to construct a planar ground electrode. Thus, any EMI caused by electromagnetic waves generated from the semiconductor device 11 or the wiring pattern 14 can be effectively reduced or possibly eliminated. Further, a stable ground voltage can be supplied to the semiconductor device 11.

Figure 4A:
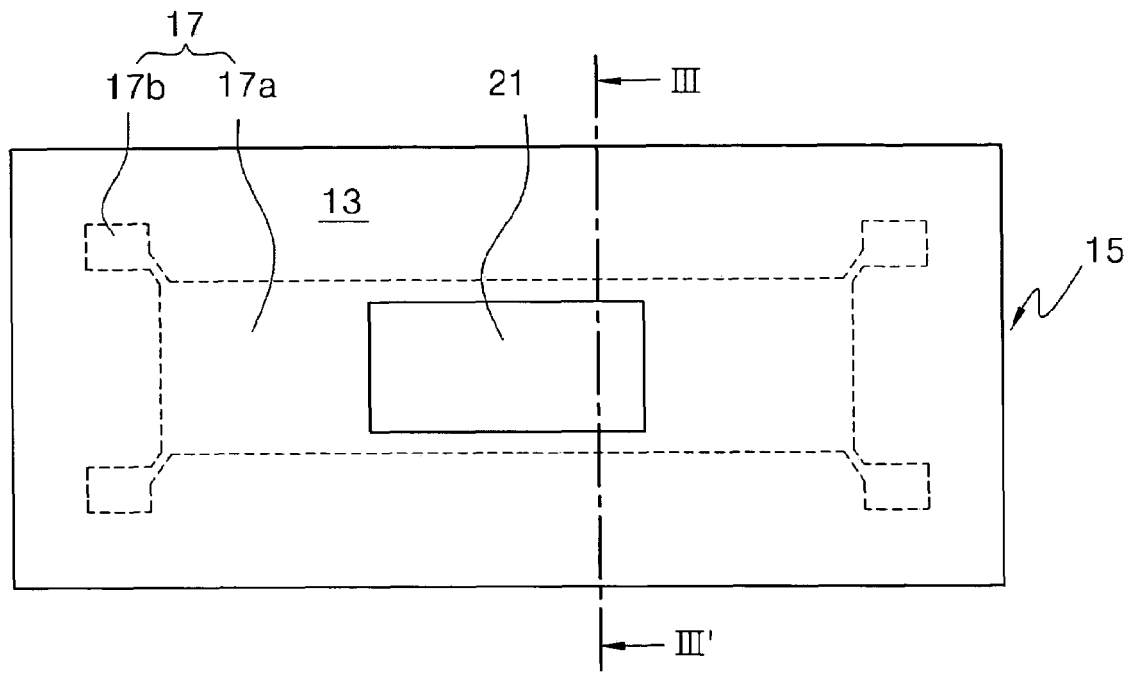
FIGS. 4A and 4B are a bottom view and a sectional view of a tape circuit substrate according to another exemplary embodiment of the present invention.
Figure 4B:
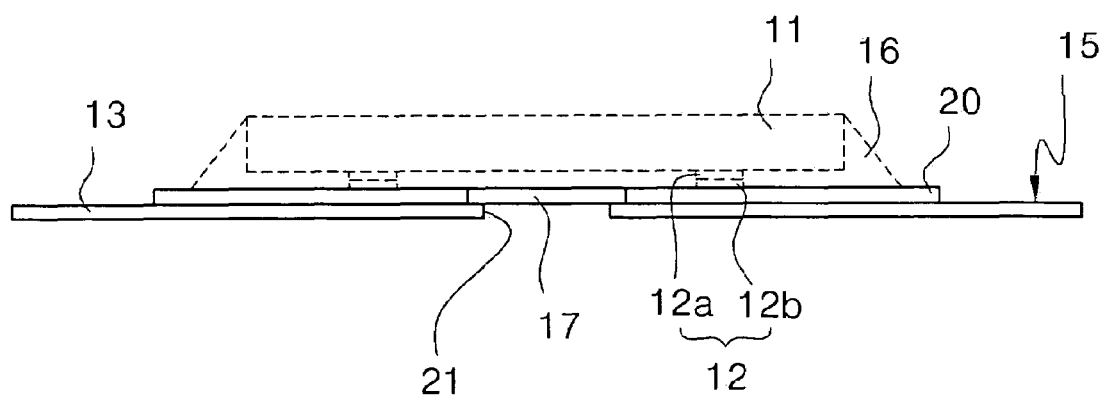

FIG. 4A is a bottom view of a tape circuit substrate according to another exemplary embodiment of the present invention; and FIG. 4B is a sectional view taken along line III-III' of FIG. 4A. As shown in FIGS. 4A and 4B, the tape circuit substrate 15 according to this exemplary embodiment of the present invention is formed with an opening 21 for exposing at least a portion of the ground electrode pattern 17 on the back of the insulation film 13. That is, a portion of the ground electrode pattern 17 is exposed by removing a portion of the insulation film 13 at an underside region of the ground electrode pattern 17, or side opposite of a side or a portion of the ground electrode pattern 17 that is closer to the semiconductor device 11 as shown in FIG. 4B, for example. The opening 21 may be formed through a portion of the insulation film 13 (as shown in FIG. 4B), or through an entire region of the insulation film 13 where the ground electrode pattern 17 is formed. Further, the opening 21 may take any shape such as circle or rectangle, for example.

With the formation of the opening 21, heat generated from the semiconductor device 11 can be more efficiently dissipated to the outside through the ground electrode pattern 17. Since a substantial amount of heat may be emitted (such as in the case of semiconductor devices mounted in electronic apparatuses such as plasma display panels (PDPs), for example) it is possible to effectively dissipate the heat using the tape circuit substrate 15 with the opening 21 formed therein.

To form the opening 21, the desired shape may be patterned through a photo/etching process on an underside of the insulation film 13 (side that is not directly adjacent to ground electrode pattern 17 and the plurality of ground electrodes 20) with the ground electrode pattern 17. A portion of the insulation film 13 at a region where the opening 21 is desired to be formed may thus be selectively removed through an etching process to form the opening 21.

Figure 5A:
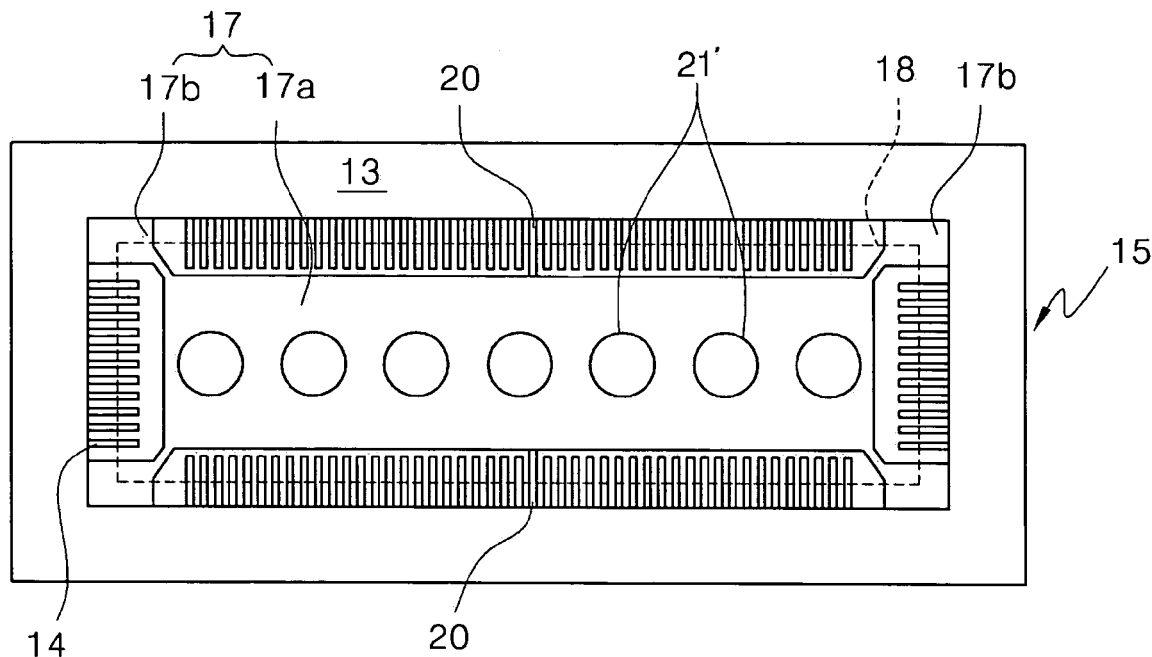
FIGS. 5A and 5B are plan views of a tape circuit substrate according to another exemplary embodiment of the present invention.
Figure 5B:
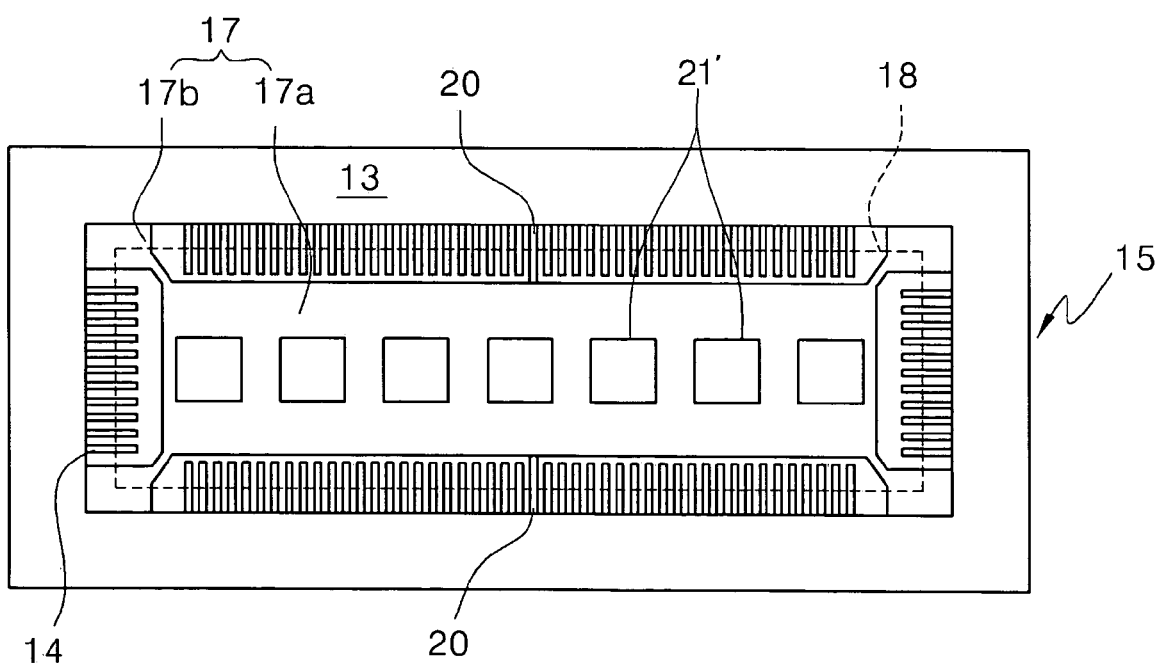

FIGS. 5A and 5B are plan views of a tape circuit substrate according to another exemplary embodiment of the present invention. As shown in FIGS. 5A and 5B, one or more openings 21' may be formed in the primary pattern 17a of the ground electrode pattern. The openings 21' may be any desired shape, shown as circles and squares in FIGS. 5A and 5B. The openings 21' may serve as passages for the sealing resin 16 to facilitate the introduction of the sealing resin 16 when the semiconductor device 11 and the tape circuit substrate 15 are sealed. Accordingly, the adhesive strength between the semiconductor device 11 and the tape circuit substrate 15 may be improved.

Figure 6:
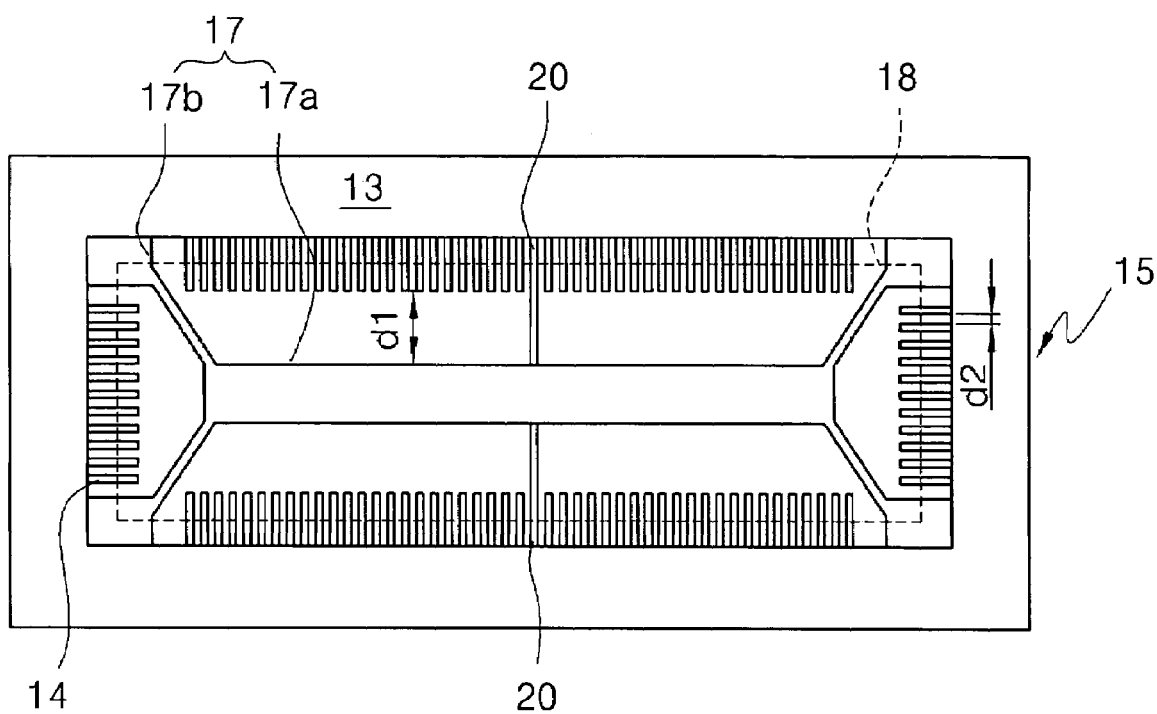
FIG. 6 is a plan view of a tape circuit substrate according to another exemplary embodiment of the present invention.

FIG. 6 is a plan view of a tape circuit substrate according to another exemplary embodiment of the present invention. As shown in FIG. 6, a distance d1 between the primary pattern 17a and the wiring pattern 14 may be wider than a pitch d2 of the wiring pattern 14, in an effort to reduce or eliminate interference between the ground voltage supplied through the ground electrode pattern 17 and the electric signals delivered to the wiring pattern 14. The distance d1 may be at least about twice as large as the pitch d2, for example; although these dimensions are only exemplary. Other dimensions, which serve to limit interference between the ground voltage supplied through the ground electrode pattern 17 and the electric signals delivered to the wiring pattern 14, may also be used.

Figure 7:
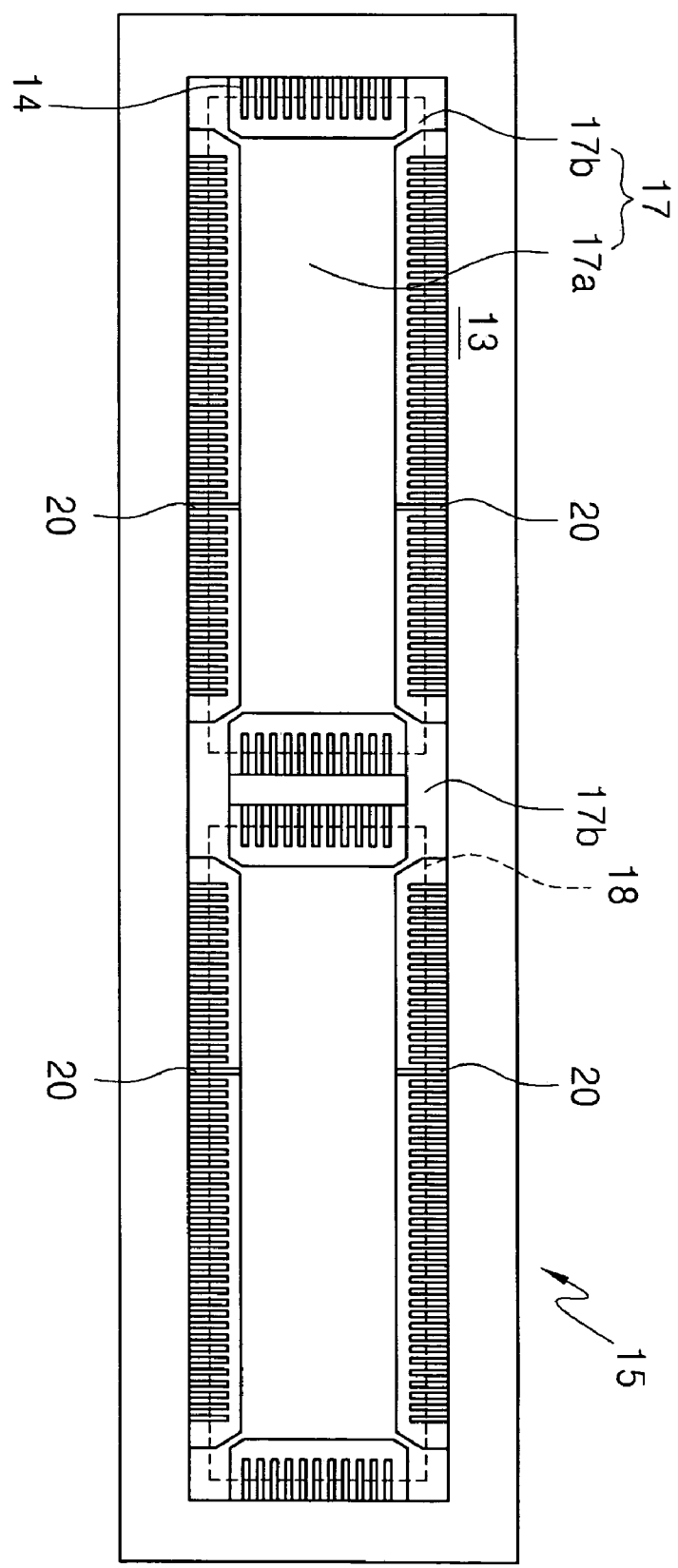
FIG. 7 is a plan view of a tape circuit substrate according to another exemplary embodiment of the present invention.

FIG. 7 is a plan view of a tape circuit substrate according to another exemplary embodiment of the present invention. In a case where a plurality of semiconductor devices 11 are mounted on a single tape circuit substrate 15, the tape circuit substrate 15 may be formed as shown in FIG. 7. For example, the plurality of wiring patterns 14 and ground electrode patterns 17 are arranged in parallel on the insulation film 13, and a plurality of auxiliary patterns 17b of the ground electrode patterns are connected to one another, respectively, as shown in FIG. 7. Accordingly, the tape circuit substrate 15 may be able to ensure a margin to bonding failure, even with a plurality of semiconductor devices 11 being mounted on the single tape circuit substrate 15. Further, the arrangement as shown in FIG. 7 may make it possible to more efficiently use an area provided for mounting the plurality of semiconductor devices 11 on the insulation film 13.

Therefore, the exemplary embodiments of the present invention may provide a tape circuit substrate that may substantially reduce or eliminate EMI in the tape circuit substrate and in a semiconductor device attached to the tape circuit substrate. Further, the exemplary embodiments of the present invention may provide a tape circuit substrate which can supply a more stable power supply voltage to a semiconductor device mounted thereon.

Although the present invention has been described in connection with the exemplary embodiments illustrated in the accompanying drawings, it can be understood by those skilled in the art that the exemplary embodiments can be implemented in other forms without departing from the scope and spirit of the present invention. Therefore, it should be understood that the exemplary embodiments are not limitative, but merely illustrative in all aspects.

What is claimed is:

1. A tape circuit substrate for mounting an electronic device, comprising:
   an insulation film;
   a wiring pattern formed on said insulation film to define an electronic device-mounting region of said insulation film, including a ground electrode and electrically connected to an electronic device to be mounted on said electronic device-mounting region via a bump electrode;
   a ground electrode pattern including a primary pattern and a plurality of auxiliary patterns, wherein said ground electrode pattern is insulated from said wiring pattern except said ground electrode;
   said primary pattern is formed on the surface of said electronic device-mounting region to expose at least a portion of said electronic device-mounting region, wherein said primary pattern is connected to said ground electrode;
   said plurality of auxiliary patterns are connected to said primary pattern and extend out of said electronic device-mounting region; and
   said insulation film formed on the entire backside of said wiring pattern and said ground electrode pattern.

2. The substrate of claim 1, wherein a shape of the primary pattern substantially conforms to a shape of the electronic device-mounting region.

3. The substrate of claim 1, wherein a shape of the primary pattern is symmetric.

4. The substrate of claim 1, wherein the auxiliary patterns are formed at corners of the insulation film.

5. The substrate of claim 4, wherein a plurality of wiring patterns and ground electrode patterns are formed on the insulation film, with auxiliary patterns of the plurality of ground electrode patterns being adjacent to and connected to each another.

6. The substrate of claim 5, wherein the plurality of ground electrode patterns are arranged in parallel on the insulation film.

7. The substrate of claim 1, wherein the ground electrode pattern is composed of the same conductive material as the wiring pattern.

8. The substrate of claim 7, wherein the ground electrode pattern is composed of copper (Cu).

9. The substrate of claim 1, wherein the primary pattern includes at least one opening therein.

10. The substrate of claim 1, wherein a distance between the ground electrode pattern and the wiring pattern is wider than a pitch in the wiring pattern.

11. The substrate of claim 1, wherein the electronic device-mounting region delivers electric signals to an electronic device that is mounted on the substrate.

12. The substrate of claim 1, wherein an active surface of the electronic device faces the ground electrode pattern.

13. The substrate of claim 1, wherein heat generated from the electronic device is dissipated to outside through the ground electrode pattern.

14. A tape circuit substrate for mounting an electronic device, comprising:
an insulation film;
a wiring pattern formed on the insulation film to define an electronic device-mounting region and including a ground electrode;
a ground electrode pattern formed at the electronic device-mounting region so as to be insulated from the wiring pattern except where the ground electrode pattern is connected to the ground electrode;
wherein the ground electrode pattern includes a primary pattern that is formed on an entire surface of the electronic device-mounting region so as to be insulated from the wiring pattern, and auxiliary patterns that are connected to the primary pattern and extend out of the electronic-device mounting region; and
an opening formed through the insulation film for exposing at least a portion of the ground electrode pattern;
wherein the wiring pattern is electrically connected to the electronic device via bump electrodes.

15. The substrate of claim 14, wherein a shape of the primary pattern substantially conforms to a shape of the electronic device-mounting region.

16. The substrate of claim 14, wherein a shape of the primary pattern is symmetric.

17. The substrate of claim 14, wherein the auxiliary patterns are formed at corners of the insulation film.

18. The substrate of claim 17, wherein a plurality of wiring patterns and ground electrode patterns are formed on the insulation film, with auxiliary patterns of the plurality of ground electrode patterns connected to one another.

19. The substrate of claim 17, wherein a plurality of ground electrode patterns are arranged in parallel on the insulation film, with auxiliary patterns of the ground electrode patterns being adjacent to and connected to each other.

20. The substrate of claim 14, wherein the ground electrode pattern is composed of the same conductive material as the wiring pattern.

21. The substrate of claim 20, wherein the ground electrode pattern is composed of copper (Cu).

22. The substrate of claim 14, wherein the primary pattern includes at least one opening therein.

23. The substrate of claim 14, wherein the distance between the ground electrode pattern and the wiring pattern is wider than a pitch in the wiring pattern.

24. The substrate of claim 14, wherein the electronic device-mounting region delivers electric signals to an electronic device that is mounted on the substrate.

25. The substrate of claim 14, wherein an active surface of the electronic device faces the ground electrode pattern.

26. The substrate of claim 14, wherein heat generated from the electronic device is dissipated to the outside of the tape circuit substrate through the ground electrode pattern.

27. A semiconductor apparatus, comprising:
an insulation film;
a wiring pattern formed on said insulation film to define an electronic device-mounting region of said insulation film, including a ground electrode and electrically connected to an electronic device to be mounted on said electronic device-mounting region via a bump electrode;
a ground electrode pattern including a primary pattern and a plurality of auxiliary patterns, wherein said ground electrode pattern is insulated from said wiring pattern except said ground electrode;
said primary pattern is formed on the surface of said electronic device-mounting region to expose at least a portion of said electronic device-mounting region, wherein said primary pattern is connected to said ground electrode;
said plurality of auxiliary patterns are connected to said primary pattern and extend out of said electronic device-mounting region;
said insulation film formed on the entire backside of said wiring pattern and said ground electrode pattern; and
a semiconductor device mounted on the electronic-device mounting region and connected to the wiring pattern via a bump electrode.

28. The apparatus of claim 27, wherein a shape of the primary pattern substantially conforms to a shape of the electronic device-mounting region.

29. The apparatus of claim 27, wherein the primary pattern takes a symmetric shape.

30. The apparatus of claim 27, wherein the auxiliary patterns are formed at corners of the insulation film.

31. The apparatus of claim 30, wherein the semiconductor device includes dummy electrodes formed at given regions on the semiconductor device which correspond to the auxiliary patterns, the dummy electrodes to be bonded to the auxiliary patterns.

32. The apparatus of claim 27, wherein the ground electrode pattern is made of the same conductive material as the wiring pattern.

33. The apparatus of claim 32, wherein the ground electrode pattern is made of copper (Cu).

34. The apparatus of claim 27, wherein the primary pattern includes at least one opening therein.

35. The apparatus of claim 27, wherein a distance between the ground electrode pattern and the wiring pattern is wider than a pitch in the wiring pattern.

36. The apparatus of claim 27, further comprising an opening formed through the insulation film for exposing at least a portion of the ground electrode pattern.

37. The apparatus of claim 27, wherein an active surface of the semiconductor device faces the ground electrode pattern.

38. The apparatus of claim 27, wherein heat generated from the semiconductor device is dissipated to the outside of the semiconductor apparatus through the ground electrode pattern.

39. A tape circuit substrate for mounting an electronic device, comprising: an insulation film;
- a wiring pattern formed on said insulation film to define an electronic device-mounting region of said insulation film, and including a ground electrode;
- a ground electrode pattern including a primary pattern and a plurality of auxiliary patterns, wherein said ground electrode pattern is insulated from said wiring pattern except said ground electrode;
- said primary pattern is formed on the surface of said electronic device-mounting region to expose at least a portion of said electronic device-mounting region, wherein said primary pattern is connected to said ground electrode; said plurality of auxiliary patterns are connected to said primary pattern and extend out of said electronic device-mounting region;
- an opening formed through the insulation film for exposing at least a portion of the ground electrode pattern; and
- wherein the wiring pattern is electrically connected to the electronic device via bump electrodes.

* * * * *